United States Patent [19]

Ogawa

[11] Patent Number: 4,701,887
[45] Date of Patent: Oct. 20, 1987

[54] SEMICONDUCTOR MEMORY DEVICE HAVING A REDUNDANCY CIRCUIT

[75] Inventor: Junji Ogawa, Tokyo, Japan

[73] Assignee: Fujitsu Limited, Kawasaki, Japan

[21] Appl. No.: 763,269

[22] Filed: Aug. 7, 1985

[30] Foreign Application Priority Data

Aug. 14, 1984 [JP] Japan .................................. 59-168772

[51] Int. Cl.$^4$ .............................................. G11C 11/40
[52] U.S. Cl. ..................................... 365/200; 365/210; 365/189
[58] Field of Search ................ 365/210, 189, 230, 200

[56] References Cited

U.S. PATENT DOCUMENTS 4,571,706  2/1986  Iwahashi ............................. 365/200
4,577,294  3/1986  Brown et al. ....................... 365/200
4,604,730  8/1986  Yoshida ............................... 365/200

Primary Examiner—Terrell W. Fears
Attorney, Agent, or Firm—Staas & Halsey

[57] ABSTRACT

A semiconductor memory device includes a random-access memory which has at least one redundancy column for replacing a defective column; a serial output circuit receives data read out in parallel from the random-access memory and serially outputs the received data redundancy circuit replaces data of the defective column with data from the redundancy column.

10 Claims, 4 Drawing Figures

SEMICONDUCTOR MEMORY DEVICE HAVING A REDUNDANCY CIRCUIT

BACKGROUND OF THE INVENTION

1. Field of the Invention

The present invention relates to a semiconductor memory device, more particularly to a semiconductor memory device having a redundancy circuit.

2. Description of the Related Art

Some types of semiconductor memory devices consist of a combination of a random-access memory (RAM) and a shift register group. This type of semiconductor memory device is, in general, used as an image memory. The shift register group is attached to the RAM for high-speed read-out of the data stored therein. The RAM is, for example, provided between a central processing unit (CPU) and a cathode-ray tube display (CRT). The data stored in the RAM is read out in parallel and input to the shift registers in accordance with control of a system. The read-out data is output serially from the shift registers to the CRT.

This type of semiconductor memory device thus enables both low-speed random access by the CPU and high-speed serial data transmission between the RAM and the CRT. In this regard, however, there has been no disclosure of a circuit giving a redundancy function to the RAM. In other words, while there is a well-known RAM having a redundancy circuit, there is no RAM having both a high-speed serial data output function and a redundancy function. Yet, a redundancy circuit is essential to raise the yield in production of a RAM.

SUMMARY OF THE INVENTION

The object of the present invention is to provide a semiconductor memory device having a serial output circuit for performing a high-speed data read-out and having a redundancy circuit for raising the yield.

In accordance with the present invention, there is provided a semiconductor memory device including a RAM having at least one redundancy column for replacing a defective column and a serial output means for receiving in parallel data read out of the RAM and serially outputting the received data. A redundancy circuit is provided for replacing data of the defective column serially output from the serial output means with data from the redundancy column.

DESCRIPTION OF THE PREFERRED EMBODIMENTS

A semiconductor memory device according to the present invention will be explained in detail with reference to the accompanying drawings.

Figure 1:
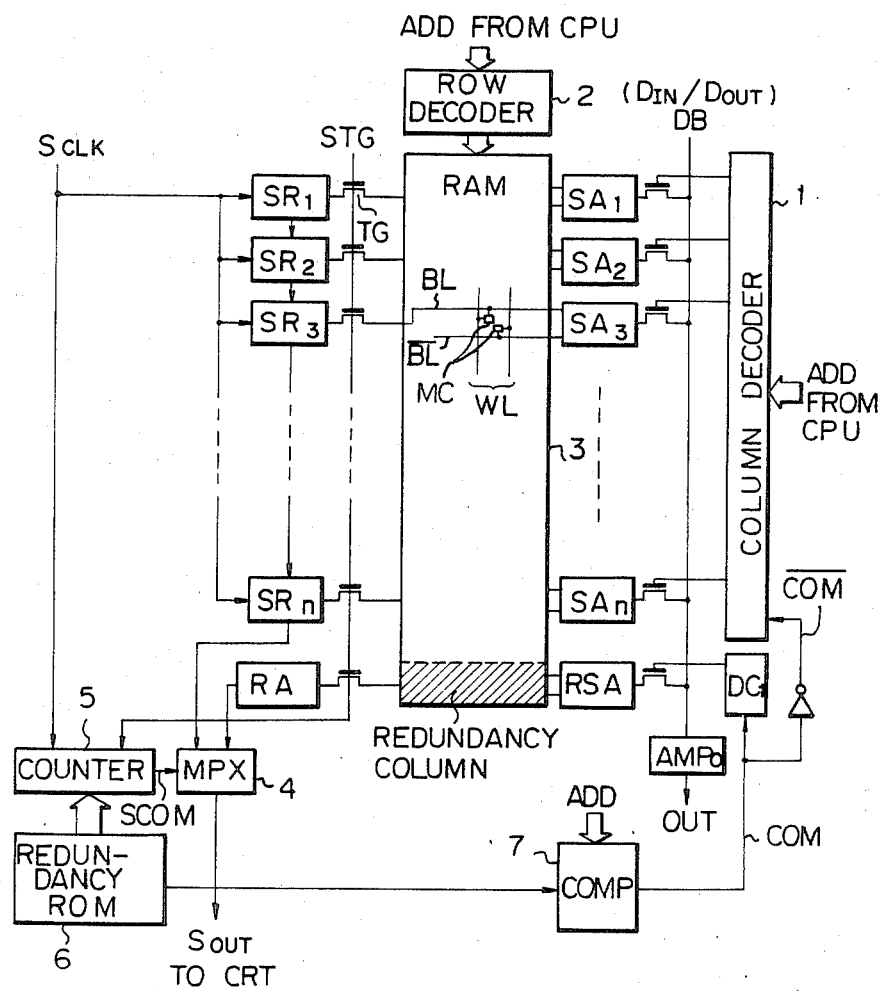
FIG. 1 is a block diagram of a semiconductor memory device according to a first embodiment of the present invention.

FIG. 1 is a block diagram of a semiconductor memory device according to a first embodiment of the present invention. In FIG. 1, reference numeral 1 represents a column decoder, 2 a row decoder, 3 an image memory (RAM), 4 a multiplexer, 5 a counter, 6 a redundancy read-only memory (redundancy ROM), and 7 a comparator. Reference letters $SA_1$ to $SA_n$ represent sense amplifiers, RSA a redundancy sense amplifier, $DC_1$ a drive circuit, $SR_1$ to $SR_n$ shift registers, and RA a redundancy amplifier. In the RAM 3, MC is a memory cell connected between word lines WL and bit lines BL and $\overline{BL}$. The bit lines BL are connected to the corresponding shift registers $SR_3$ through a transfer gate TG, and the word lines WL are connected to the row decoder 2. The slanted line portion in the RAM 3 indicates the redundancy column.

The redundancy circuit according to the embodiment of the present invention is formed by the drive circuit $DC_1$, the redundancy sense amplifier RSA, the redundancy amplifier RA, the multiplexer 4, the counter 5, the redundancy ROM 6, and the comparator 7.

In the inspection of the manufacture of the RAM, when a defective column is found, the column address indicating the defective column is stored in the redundancy ROM and the redundancy ROM is enabled. That is, the redundancy ROM 6 is enabled to provide the column address (or addresses) corresponding to the defective column (or columns) of the RAM 3. Storage of the defective column address in the redundancy ROM 6 is performed by cutting a polycrystalline silicon fuse. This technique is a well-known. There are two known methods for cutting a polycrystalline silicon fuse, i.e., one method utilizing a laser beam and another method utilizing electrical current.

The semiconductor memory device according to the present invention basically operates such that when a defective column in the RAM is accessed by an address ADD sent from the CPU, the defective column is immediately changed to the redundancy column in the memory area indicated by the slanted line. That is, this memory area is reserved for a redundancy function. Accordingly, even if a defective column is found in the RAM, the device can operate as a normal memory.

The operation of this device will be explained in detail hereinafter.

If a defect is found in the column corresponding to, for example, the sense amplifier $SA_2$, the corresponding column address is stored in the redundancy ROM 6.

In the random access mode, during a read-out operation when the input address ADD from the CPU is applied to the column decoder 1 and the comparator 7, if a defective column address is not included in the input address, data corresponding to the input address is output from the RAM to the data bus DB through the corresponding sense amplifiers and output from the amplifier $AMP_0$. During a writing operation, write data corresponding to the input address is input to the RAM from the data bus DB.

Assume a defective column address corresponding to the sense amplifier $SA_2$ is included in the input address. The comparator 7 compares the input column addresses with the stored defective column address in the redundancy ROM 6. When one of the input column addresses coincides with the stored defective column address, a coincidence signal COM is input to the drive circuit $DC_1$ and an inverted coincidence signal $\overline{COM}$ is input to the column decoder 1. When the coincidence signal COM is input to the drive circuit $DC_1$, the drive circuit $DC_1$ activates the redundancy sense amplifier RSA and the redundancy column is employed. Accordingly, data from the data bus DB is read out from or written into the RAM using the redundancy column instead of the defective column.

During a serial output mode, data stored in the RAM is simultaneously read out in parallel to the shift registers $SR_1$ to $SR_n$ through the transfer gates TG. Accordingly, data corresponding to the defective column is also read out to one of the shift registers, for example, to the shift register $SR_2$. Each shift register sequentially transfers the input data to the next shift register every clock signal $S_{CLK}$. Finally, the input data is shifted to the final shift register $SR_n$ and input to the multiplexer 4. Data corresponding to the redundancy column, i.e., the correct data, is latched in the redundancy amplifier RA. When the data corresponding to the defective column, i.e., the defective data, is shifted to the multiplexer 4 (that is, the data of the shift register $SR_2$ is transferred to the multiplexer 4 through the shift register $SR_n$), the multiplexer 4 replaces the defective data with the correct data latched in the redundancy amplifier RA for output to the CRT. Accordingly, correct serial outputs $S_{OUT}$ can be obtained at a high speed.

The data replacement operation in the multiplexer 4 will be explained in more detail below.

As mentioned above, the defective column address is previously stored in the redundancy ROM 6. That is, the number of the defective column with respect to the final column (final shift register $SR_n$) is stored in the redundancy ROM 6. The number of columns between the final column and the defective column is read out from the redundancy ROM 6 and input to the counter 5. Accordingly, the counter 5 is initially set to that number of columns after it is preset by the transfer gate signal STG.

The clock signal $S_{CLK}$ is input to the counter 5 and input in parallel to the shift registers $SR_1$ to $SR_n$. The counter 5 subtracts one from the number of columns initially set every clock signal $S_{CLK}$. At the same time, the data of the shift register is shifted to the next shift register every clock signal $S_{CLK}$. When the count becomes "0", the counter 5 outputs a coincidence signal SCOM to the multiplexer 4. At this time, since the defective data shifted by the shift registers arrives at the multiplexer 4, the multiplexer 4 can replace the defective data with the correct data based on the coincidence signal SCOM. Accordingly, serial output of the correct data can be obtained from the multiplexer 4 and transmitted to the CRT.

When the transfer gate control signal STG is ON, all transfer gates TG are simultaneously turned ON so as to transfer the data from the RAM in parallel into the shift registers $SR_1$ to $SR_n$.

Figure 2:
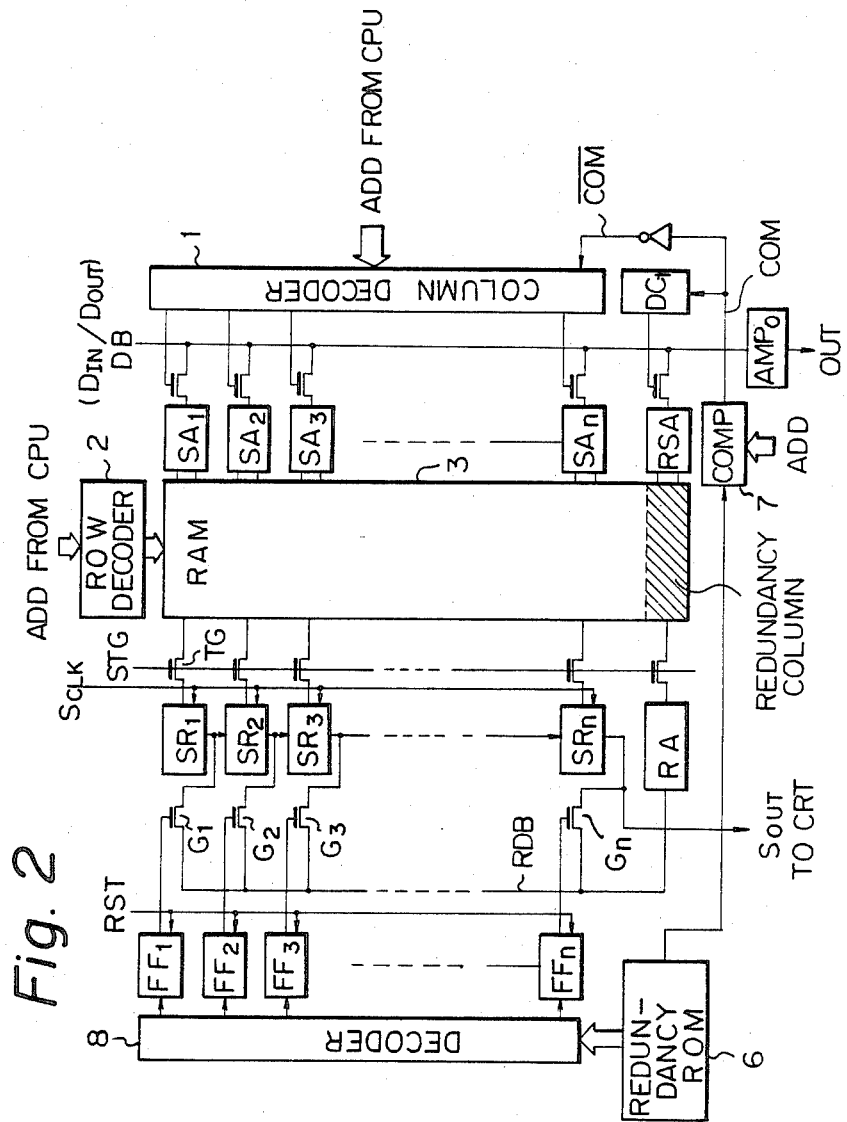
FIG. 2 is a block diagram of a semiconductor memory device according to a second embodiment of the present invention.

FIG. 2 is a block diagram of a semiconductor memory device according to a second embodiment of the present invention. In FIG. 2, the same reference numerals and letters as in FIG. 1 indicate the same elements. In this embodiment, a decoder 8, flip-flop circuits $FF_1$ to $FF_n$, gates $G_1$ to $G_n$, and data bus RDB are provided instead of the multiplexer 4 and the counter 5 shown in FIG. 1.

As mentioned above, the defective column address is previously stored in the redundancy ROM 6.

In this embodiment, in the random access mode, the same read/write operations of the redundancy column as in FIG. 1 are performed. Accordingly, explanations of these operations will be omitted.

In the serial output mode, when data corresponding to the defective column is read out from the RAM to one of the shift registers, for example, to the shift register $SR_2$, the defective data is replaced by the correct data sent from the redundancy amplifier RA through the redundancy data bus RDB and the gate $G_2$ during the first shift operation. That is, the information regarding the defective column address stored in the redundancy ROM 6 is applied to the decoder 8. The decoder sets the corresponding flip-flop circuit. In this case, the flip-flop circuit $FF_2$ is set by the decoder 8. Since all flip-flop circuits $FF_1$ to $FF_n$ have been reset in the initial state, only the flip-flop circuit $FF_2$ is set, and the corresponding gate $G_2$ is turned ON by the output of the flip-flop circuit $FF_2$. Other gates $G_1$ and $G_3$ to $G_n$ are turned OFF.

Accordingly, as explained above, the correct data latched in the redundancy amplifier RA is sent to the output of the shift register $SR_2$ through the data bus RDB and the defective data is replaced with the correct data. Consequently, the correct serial outputs can be obtained from the final shift register $SR_n$ and transmitted to the CRT.

Figure 3:
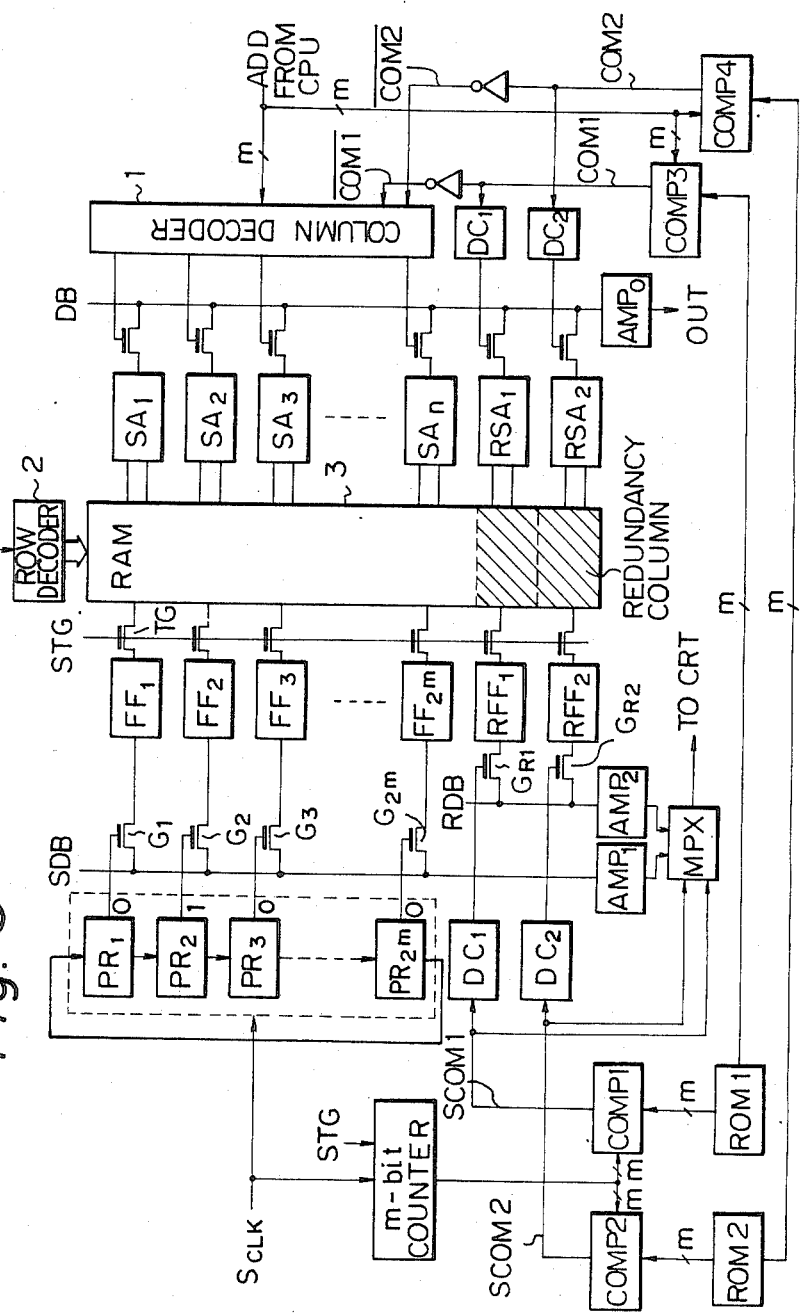
FIG. 3 is a block diagram of a semiconductor memory device according to a third embodiment of the present invention.

FIG. 3 is a block diagram of a semiconductor memory device according to another embodiment of the present invention. In this case, an additional redundancy column (slanted portion) is added to the memory area in the RAM 3. As can be understood, the yield of the RAM can be raised by the additional redundancy column over the single redundancy column shown in FIGS. 1 and 2. In FIG. 3, reference letter m represents an m-bit address along with the additional column, the redundancy sense amplifier $RSA_2$, the drive circuit $DC_2$, the comparator $COMP_4$, and the redundancy ROM 2 are newly added to the redundancy circuit.

In the same way as explained above, a second defective column address is previously stored in the redundancy ROM 2. Of course, the first defective column address is previously stored in the redundancy ROM 1.

In this embodiment, in the random access mode, the same read/write operations of the redundancy columns shown in FIG. 1 are performed. Accordingly, explanation of the operations will be omitted.

Reference letters $PR_1$ to $PR_2m$ represent so-called pointers functioning as a ring counter in the serial output mode. Reference letters $FF_1$ to $FF_2m$ represent flip-flop circuits. The pointers and flip-flop circuits perform the same function as the shift register group shown in FIGS. 1 and 2. Each of the pointers $PR_1$ to $PR_2m$ can shift the signal "1" in response to the clock signal $S_{CLK}$. That is, the signal "1" is sequentially shifted from the first pointer $PR_1$ to the final pointer $PR_2m$. Accordingly, only one pointer becomes "1". The other pointers become "0". In this case, a preset means may be provided in order to preset the pointer $PR_1$ so as to become "1" at the start position of the serial operation. When a pointer becomes "1", the corresponding gate is turned ON and the data latched in the flip-flop circuit is read out through the data bus SDB. Accordingly, the data in the RAM is sequentially read out through the shift data bus SDB by the sequential turning ON of each gate in response to the signal "1" of the pointer.

If defective data is latched in the flip-flop circuit $FF_2$, when the pointer $PR_2$ becomes "1", the gate $G_2$ is turned ON and the defective data is sent to the multiplexer MPX through the amplifier $AMP_1$. Also, when the pointer $PR_2$ becomes "1", the gate $G_{R1}$ is turned ON by the coincidence signal SCOM1 sent from the comparator COMP1. Accordingly, the correct data latched in the redundancy flip-flop circuit $RFF_1$ is read out to the amplifier $AMP_2$ through the gate $G_{R1}$ and the redundancy data bus RDB. Since the coincidence signal SCOM1 is simultaneously input to the multiplexer MPX, the multiplexer MPX can replace the defective data with the correct data.

In this case, as explained in FIG. 1, the coincidence signal SCOM1 is generated when the comparator COMP1 compares the number of the defective column address stored in the redundancy ROM 1 with the number of the m-bit counter and detects coincidence therebetween. The m-bit counter is preset by the transfer gate signal STG.

As can be understood, the same explanations apply to the second redundancy column using the redundancy ROM 2, the comparator COMP2, and the coincidence signal SCOM2.

This method using pointers can reduce power consumption compared with the method using shift registers shown in FIGS. 1 and 2. This is because each shift register must sequentially transfer data to the next shift register. Conversely, only one selected point need transfer data to the output.

Figure 4:
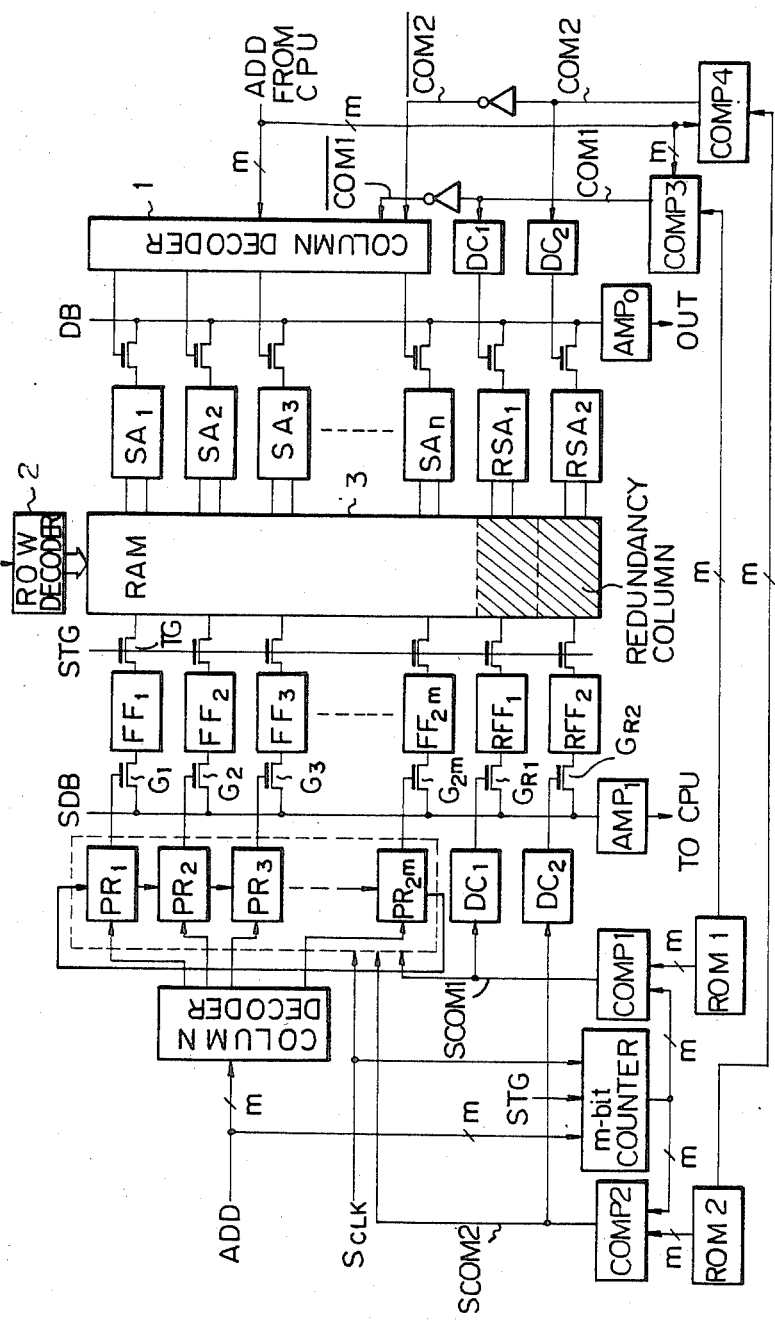
FIG. 4 is a block diagram of a semiconductor memory device according to a fourth embodiment of the present invention.

FIG. 4 is a block diagram of a semiconductor memory device according to still another embodiment of the present invention. In FIG. 4, the same structure as that of FIG. 3 is used for the random access mode.

During the serial output mode, the shift data bus SDB is used for the redundancy data bus RDB. Accordingly, the redundancy data bus RDB is eliminated and the redundancy flip-flop circuits $RFF_1$ and $RFF_2$ are connected to the shift data bus SDB through the gates $G_{R1}$ and $G_{R2}$.

In this embodiment, the gate corresponding to the defective data, for example, the gate $G_2$, is not turned ON since the corresponding pointer $PR_2$ does not output the signal "1". In this case, all pointers become "0" because the clock signal $S_{CLK}$ is not applied to them. Alternatively, the gate $G_{R1}$ is turned ON at the same time based on the coincidence signal SCOM1 so that the correct data latched in the redundancy flip-flop circuit $RFF_1$ is output to the amplifier $AMP_1$ through the gate $G_{R1}$ and the shift data bus SDB. Regarding the pointers coupled to the column decoder, since the start position of the signal "1" pointer can be arbitrarily selected by the column decoder, the corresponding gate can be turned ON so that the data stored in the RAM can be read out from the corresponding column. That is, an arbitrary head address can be designated by the pointer. This is advantageous for so-called "scrolling" of the image data. As can be understood, advantages similar to those of the embodiment shown in FIG. 3 are obtained by this embodiment.

What is claimed is:

1. A semiconductor memory device operatively connected to receive a clock signal, comprising:
   a random-access memory arranged in columns having addresses and including at least one redundancy column for replacing a defective column;
   serial output means, operatively connected to said random-access memory, for receiving data read out of said random-access memory in parallel and serially outputting the received data; and
   redundancy means, operatively connected to said serial output means and operatively connected to receive the clock signal, for replacing data from said defective column serially output from said serial output means with data from said redundancy column, said redundancy means comprising:
   at least one read-only memory for storing an address corresponding to said defective column;
   at least one latch means, operatively connected to said redundancy column, for latching data read out of said redundancy column;
   at least one comparator, operatively connected to said at least one read-only memory, for comparing an input column address with the defective column address and for outputting a coincidence signal when said input column address coincides with said defective column address;
   at least one counter, operatively connected to said at least one read-only memory and operatively connected to receive the clock signal, being activated by the clock signal and outputting a coincidence signal when the number in said counter coincides with a column number indicating said defective column; and
   a multiplexer, operatively connected to said counter, for replacing data in said defective column with data in said redundancy column upon receipt of said coincidence signal.

2. A semiconductor memory device as claimed in claim 1, wherein said serial output means comprises:
   a plurality of flip-flop circuits, operatively connected to said random-access memory, for latching the data read out from said random-access memory;
   a plurality of gates, operatively connected to said plurality of flip-flop circuits, for transferring the data latched in said plurality of flip-flop circuits;
   a plurality of pointers, operatively connected to receive a clock signal, for sequentially turning ON in response to the clock signal; and
   a shift data bus, operatively connected to said plurality of gates, for outputting the data.

3. A semiconductor memory device as claimed in claim 2, further comprising:
   at least one redundancy flip-flop circuit, operatively connected to said redundancy column, for latching data read out from said redundancy column; and
   a redundancy data bus, operatively connected to said at least one redundancy flip-flop circuit, for outputting data latched in said at least one redundancy flip-flop circuit.

4. A semiconductor memory device as claimed in claim 2, further comprising at least one redundancy flip-flop circuit, operatively connected between said redundancy column and said shift data bus, for latching data read out from said redundancy column.

5. A semiconductor memory device as claimed in claim 2, wherein a start position for said plurality of pointers is arbitrarily selected by the clock signal.

6. A semiconductor memory device as claimed in claim 1, wherein said at least one read-only memory has a random-access mode and a serial output mode.

7. A semiconductor memory device comprising:

a random-access memory arranged in columns having addresses and including at least one redundancy column for replacing a defective column;

serial output means, operatively connected to said random-access memory, for receiving data read out of said random-access memory in parallel and serially outputting the received data; and redundancy means, operatively connected to said serial output means, for replacing data from said defective column serially output from said serial output means with data from said redundancy column, said redundancy means comprising:

at least one read-only memory for storing an address corresponding to said defective column;

at least one latching means, operatively connected to said at least one redundancy column, for latching the data read out from said at least one redundancy column;

at least one comparator, operatively connected to said at least one read-only memory, for comparing an input column address with said defective column address and for outputting a coincidence signal when said input column address coincides with said defective column address;

a decoder, operatively connected to said at least one read-only memory, for decoding said defective column address;

a plurality of flip-flop circuits, operatively conencted to said decoder circuit, for receiving said defective column address;

a plurality of gates, operatively connected to said corresponding ones of said plurality of flip-flop circuits, for receiving said defective column address and turning ON corresponding gates in accordance with said defective column address; and a data bus, operatively connected to said plurality of gates, for replacing data in said defective column with said data in said redundancy column.

8. A semiconductor memory device as claimed in claim 7, wherein said at least one read-only memory has a random-access mode and a serial output mode.

9. A semiconductor memory device comprising:

a random-access memory arranged in columns having addresses and including at least one redundancy column for replacing a defective column;

serial output means, operatively connected to said random-access memory, for receiving data read out of said random-access memory in parallel and serially outputting the received data, said serial output means comprising:

a plurality of flip-flop circuits, operatively connected to said random-access memory, for latching the data read out from said random-access memory;

a plurality of gates, operatively connected to said plurality of flip-flop circuits, for transferring the data latched in said plurality of flip-flop circuits;

a plurality of pointers, operatively connected to receivea clock signal, for sequentially turning ON in response to the clock signal; and a shift data bus, operatively connected to said plurality of gates, for outputting the data; and redundancy means, operatively connected to said serial output means, for replacing data from said defective column serially output from said serial output means with data from said redundancy column.

10. A semiconductor memory device comprising:

a random-access memory having a plurality of regular columns and at least one redundancy column, for replacing a defective one of said regular columns;

random-access input and output means, operatively connected to said random-access memory, for inputting data and outputting data from a selected one of said plurality of regular columns and said at least one redundancy column;

serial output means, operatively connected to said random-access memory independently of said random-access input and output means, for reading out data from said regular columns and said at least one redundancy column in parallel and serially outputting said read-out data; and redundancy control means, operatively connected to said serial output means, for replacing read-out data corresponding to said defective one of said regular columns with data from said at least one redundancy column.

* * * * *

UNITED STATES PATENT AND TRADEMARK OFFICE
CERTIFICATE OF CORRECTION

PATENT NO. : 4,701,887
DATED : OCTOBER 20, 1987
INVENTOR(S) : JUNJI OGAWA

It is certified that error appears in the above-identified patent and that said Letters Patent is hereby corrected as shown below:

FRONT PAGE [57] ABSTRACT, line 3, "column; a" should be --column. A--;
line 5, "data" should be --data.--.

Col. 2, line 18, "BL" (first occurrence) should be --$\overline{BL}$--;
line 58, delete "not".

Col. 3, line 4, "COM" should be --$\overline{COM}$--.

Col. 7, line 31, "conencted" should be --connected--.

Col. 8, line 16, "receivea" should be --receive a--.

Signed and Sealed this

Twelfth Day of April, 1988

Attest:

DONALD J. QUIGG

Attesting Officer

Commissioner of Patents and Trademarks